(12) United States Patent
Lin et al.

(10) Patent No.: US 8,592,995 B2
(45) Date of Patent: Nov. 26, 2013

(54) METHOD AND STRUCTURE FOR ADHESION OF INTERMETALLIC COMPOUND (IMC) ON CU PILLAR BUMP

(75) Inventors: Jing-Cheng Lin, Hsinchu County (TW); Chen-Hua Yu, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 68 days.

(21) Appl. No.: 12/825,822

(22) Filed: Jun. 29, 2010

(65) Prior Publication Data

US 2011/0001250 A1 Jan. 6, 2011

Related U.S. Application Data

(60) Provisional application No. 61/222,860, filed on Jul. 2, 2009.

(51) Int. Cl.
*H01L 23/50* (2006.01)

(52) U.S. Cl.
USPC .... 257/778; 257/737; 257/738; 257/E23.023; 438/612; 438/613

(58) Field of Classification Search
USPC .......... 257/778, 737, 738, E23.023; 438/614, 438/615, 612, 613
See application file for complete search history.

(56) References Cited

U.S. PATENT DOCUMENTS

| | | | | |
|---|---|---|---|---|
| 6,083,633 A | * | 7/2000 | Fister et al. | 428/615 |
| 6,130,479 A | | 10/2000 | Chalco et al. | |
| 6,879,041 B2 | * | 4/2005 | Yamamoto et al. | 257/737 |
| 6,919,137 B2 | * | 7/2005 | Kawashima et al. | 428/617 |
| 7,276,801 B2 | | 10/2007 | Dubin et al. | |
| 7,919,859 B2 | * | 4/2011 | Zhong et al. | 257/737 |
| 2003/0222352 A1 | * | 12/2003 | Kung et al. | 257/772 |

(Continued)

FOREIGN PATENT DOCUMENTS

| | | | |
|---|---|---|---|
| CN | 1654703 | | 8/2005 |
| JP | 06-196349 | * | 7/1994 |
| JP | 06196349 | * | 7/1994 |

OTHER PUBLICATIONS

Chang, Junling, et al., "On the Formation of Cu-Ni-Sn Ternary Intermetallics in SMT Solder Joints", Proceeding of HDP'04, IEEE, pp. 66-69, 2004.

(Continued)

*Primary Examiner* — Andy Huynh
(74) *Attorney, Agent, or Firm* — Lowe Hauptman & Ham, LLP

(57) ABSTRACT

A method and structure for good adhesion of Intermetallic Compounds (IMC) on Cu pillar bumps are provided. The method includes depositing Cu to form a Cu pillar layer, depositing a diffusion barrier layer on top of the Cu pillar layer, and depositing a Cu cap layer on top of the diffusion barrier layer, where an intermetallic compound (IMC) is formed among the diffusion barrier layer, the Cu cap layer, and a solder layer placed on top of the Cu cap layer. The IMC has good adhesion on the Cu pillar structure, the thickness of the IMC is controllable by the thickness of the Cu cap layer, and the diffusion barrier layer limits diffusion of Cu from the Cu pillar layer to the solder layer. The method can further include depositing a thin layer for wettability on top of the diffusion barrier layer prior to depositing the Cu cap layer.

20 Claims, 4 Drawing Sheets

(56) References Cited

U.S. PATENT DOCUMENTS

| | | | |
|---|---|---|---|
| 2006/0068218 A1* | 3/2006 | Hooghan et al. | 428/615 |
| 2007/0158391 A1* | 7/2007 | Son et al. | 228/101 |
| 2007/0284740 A1* | 12/2007 | Ano | 257/738 |

OTHER PUBLICATIONS

Kim, Byoung-Joon et al., "Intermetallic Compound and Kirkendall Void Growth in Cu Pillar Bump During Annealing and Current Stressing", 2008 Electronic Components and Technology Conference, IEEE, pp. 336-340.

Ebersberger, Bernd et al., "Cu Pillar Bumps as a Lead-Free Drop-in Replacement for Solder-Bumped, Flip-Chip Interconnects", 2008 Electronic Components and Technology Conference, IEEE, pp. 59-66.

Shin, Chang-Keun, et al., "Effect of Cu-Containing Solders on the Critical IMC Thickness for the Shear Strength of BGA Solder Joints", 2000 Electronics Packaging Technology Conference, IEEE, pp. 406-411.

Yu, Jinhua, et al., "Reliability Study on Copper Pillar Bumping with Lead Free Solder", 2007 9th Electronics Packaging Technology Conference, IEEE, pp. 618-622.

Nah, Jae-Woong, et al., "Electromigration Study in Flip Chip Solder Joints", 2007 Electronic Components and Technology Conference, IEEE, pp. 1450-1455.

Huffman, Alan, et al., "Effects of Assembly Process Parameters on the Structure and Thermal Stability of Sn-Capped Cu Bump Bonds", 2007 Electronic Components and Technology Conference, IEEE, pp. 1589-1596.

Jang, J. W., et al., "Morphology of Interfacial Reaction Between Lead-Free Solders and Electroless Ni-P Under Bump Metallization", 2000 American Institute of Physics, Journal of Applied Physics, vol. 88, No. 11, pp. 6359-6363.

Office Action from corresponding application No. CN 201010222594.2, May 18, 2012.

Notice of Allowance of Patent and English translation dated Oct. 1, 2013 from corresponding application No. KR 10-2010-0063691.

* cited by examiner

METHOD AND STRUCTURE FOR ADHESION OF INTERMETALLIC COMPOUND (IMC) ON CU PILLAR BUMP

CROSS-REFERENCE TO RELATED APPLICATIONS

The present application claims priority of U.S. Provisional Patent Application Ser. No. 61/222,860, filed on Jul. 2, 2009, which is incorporated herein by reference in its entirety.

TECHNICAL FIELD

This invention relates generally to a flip chip attachment method, more particularly using a Cu pillar bump.

BACKGROUND

Flip chip, or Controlled Collapse Chip Connection (C4), is a method for interconnecting semiconductor devices, such as integrated circuit chips and MEMS, to external circuitry with solder bumps that have been deposited onto the chip pads. The solder bumps are deposited on the chip pads on the topside of the wafer during the final wafer processing step. In order to mount the chip to external circuitry (e.g., a circuit board or another chip or wafer), it is flipped over so that its top side faces down, and aligned so that its pads align with matching pads on the external circuit, and then the solder is flowed to complete the interconnect.

Conventional flip-chip attachment methods using standard (ball-shaped) bumps suffer the following defects: 1) inconsistent gaps between die and substrate, 2) reduced pitch reduces the gap between die and substrate, 3) substrate solder mask opening variations change the gap, and 4) bump diameter variation causes inconsistent underfill.

In contrast, a pillar-bump flip-chip attachment method uses pillar-shaped bumps instead of ball-shaped bumps and has the following advantages: 1) consistent gaps between die and substrate (rigid-bump), 2) a fine pitch bump with no change in bump height, thus reduced die size, e.g., 80 µm fine pitch, 3) no solder mask (SM) eliminates SM-related defects, 4) consistent underfill with pillar-shape bumps, and 5) flexible pad locations—resolving critical design bottlenecks.

In particular, copper pillar solder bumps (CPB) have the following advantages: 1) better thermal/electric performance, 2) higher current carrying capacity, 3) better resistance to electromigration, thus longer bump life, 4) minimizing molding voids—i.e., more consistent gaps between Cu-pillar-bumps. Also, a lower cost substrate is possible by using Cu-pillar controlled solder spreading, eliminating lead-free teardrop design, and using fine-pitch maskless substrate and bare Cu pads. Further, CPB provides soft error protection for sensitive devices (e.g., memory chips), i.e., "Alpha emission" protection by Cu-pillar distance. A CPB also means that a lead-free pillar bump is available.

The presence of Cu in the solder also affects the adhesion of the Intermetallic Compound (IMC). In the Cu-containing solder alloy, the interfacial IMC (e.g., Sn—Cu—Ni) adheres to the electroless under-bump metal (UBM, e.g., Ni—P). Without Cu (e.g., Ni—Sn or Ni—Sn—Ag), the IMC (e.g., needle-type $Ni_3Sn_4$) loses adhesion and spalls off the electroless UBM interface (e.g., Ni—P).

However, there are concerns regarding the Intermetallic Compound (IMC) and Kirkendall void growth in Cu pillar bumps during annealing and current stressing. When used with Sn solder material, sufficient Cu supply from Cu pillar forms a thick IMC, such as $Cu_6Sn_5$ and $Cu_3Sn$, through the reaction between Cu and Sn. Thick IMC layers reduce the mechanical strength of the Cu pillar bumps because IMCs are brittle. The IMC becomes scalloped and spalls off the interface. With thicker (e.g., 20 mm) Sn solder, longer annealing processes and an abundant Cu source make $Cu_3Sn$ thicker, and also the size of $Cu_6Sn_5$ becomes large. Total transfer of the ductile solder to harder IMC lowers the shear strength of the structure. Also, thicker IMC results in poor adhesion. Further, Kirkendall voids can develop at the pillar and $Cu_3Sn$ interface, resulting in a bad interface and poor contact between the Cu pillar and $Cu_3Sn$.

Accordingly, new method and structure for good adhesion of Intermetallic Compound (IMC) on Cu pillar bumps and reliable structural integrity are desired.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that these embodiments provide many applicable inventive concepts that can be implemented in a wide variety of specific contexts. The specific embodiments discussed are merely illustrative, and do not limit the scope of the invention.

A method and structure for good adhesion of Intermetallic Compounds (IMC) on a Cu pillar bump are provided. Throughout the various views and illustrative embodiments, like reference numbers are used to designate like elements.

Figure 1:
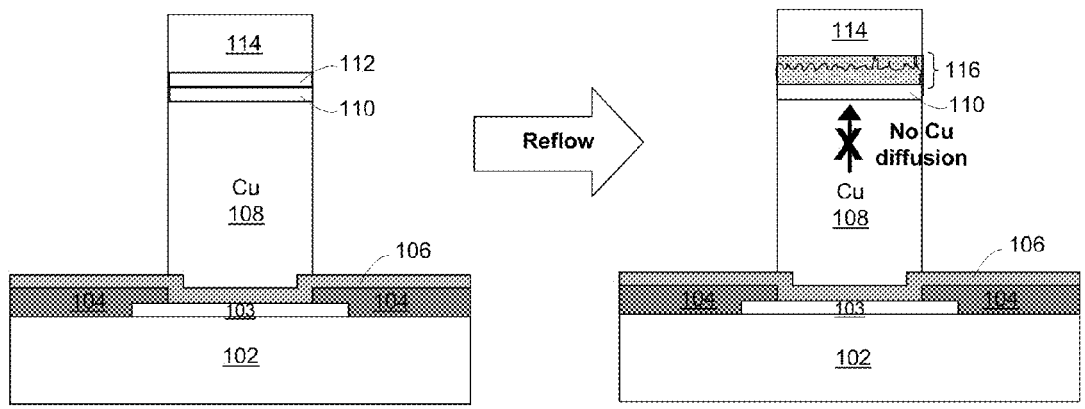
FIG. 1 illustrates an exemplary structure for good adhesion of IMC on a Cu pillar bump according to one embodiment.

FIG. 1 illustrates an exemplary structure for good adhesion of IMC on Cu pillar bumps according to one embodiment. The structure has a semiconductor wafer (e.g., Si) with a patterned daisy chain 102 (a daisy chain is a group of vias that link with short metal lines), metal line layer 103 (e.g., Al, Cu, or AlCu), a passivation layer 104 (with opening), a seed layer 106 (e.g., TiW/Cu, Ti/Cu, or Ti/Cu/NiAu, etc.), a Cu pillar 108, a diffusion barrier layer 110 (e.g., Ni, Ni(P), or Ni(V), etc.), a Cu cap layer 112, and a solder layer 114 (e.g., Sn—Ag, Sn, or Sn—Ag (Cu): Cu weight<0.3%, etc.).

The diffusion barrier layer 110 blocks Cu diffusion from the Cu pillar 108 to the solder layer 114. Without the diffusion barrier layer 110, a very thick IMC can form at the interface with the solder layer 114 with an abundant Cu source from the Cu pillar 108. The result is weak strength and poor adhesion. On top of the diffusion barrier layer 110, a thin layer for better wettability can be deposited (e.g., Au).

The thin Cu cap layer 112 provides a limited Cu source to react with the solder layer 114 (e.g., Sn) that also reacts with the diffusion barrier layer 110 (e.g., Ni). The Cu cap layer 112 can have a thickness of about 0.1 um-1.5 um to form a controllable IMC (e.g., $(Cu,Ni)_xSn_y$) after reflow soldering. The reflow soldering is a process in which a solder paste (a sticky mixture of powdered solder and flux) is used to temporarily hold the components to their attachment pads, after which the assembly is carefully heated in order to solder the joint. The assembly may be heated by an infrared lamp, or by passing it through a carefully controlled oven, or soldering with a hot air pencil.

After the reflow, an IMC layer 116 is formed among the Cu cap layer 112, the diffusion barrier layer 110 (e.g., Ni), and the solder layer 114 (e.g., Sn). For example, with Ni diffusion barrier layer 110 and Sn solder layer 114, the Cu—Ni—Sn IMC thickness can be controlled to less than 7 µm with a Cu cap layer of 0.1 µm-1.5 µm. The Cu—Ni—Sn IMC layer provides good interfacial adhesion. Without Cu (e.g., Ni—Sn or Ni—Sn—Ag), the IMC (e.g., needle-type $Ni_3Sn_4$) can lose adhesion and spall off the interface.

The Cu pillar 108 can have thickness (height) of about 5 µm-150 µm. The diffusion barrier layer 110 (e.g., Ni, Ni(P), or Ni(V), etc.) can be plated using either electroplating or electroless plating, and can have a thickness of about 0.5 µm-4 µm. If a thin layer for better wettability (e.g., Au) is deposited on top of the diffusion barrier layer 110, it can have a thickness of about 0.01 µm-0.5 µm.

The solder layer 114 can be made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc. The solder volume does not change during thermal annealing. If the solder layer 114 is Sn—Ag, a controllable $(Cu,Ni)_xSn_y$ IMC layer with good adhesion is formed at the interface. $Ag_3Sn$ is good for electromigration (EM) resistance, but still needs to control the percentage of Ag to avoid large size of $Ag_3Sn$ formation.

FIG. 2A-FIG. 2K illustrate an exemplary process for good adhesion of IMC on a Cu pillar bump according to another embodiment. On the semiconductor wafer 102 (e.g., Si), a passivation layer 104 is formed in FIG. 2A. Passivation is the process of making a material passive (inactive) in relation to another material prior to using the materials together. In the process, chemically and electrically active broken bonds at the semiconductor surface are saturated, and hence de-activated, by reaction with selected element; e.g., hydrogen passivates broken Si bonds at the surface; oxide grown on Si surface passivates it as well.

Figure 2A:
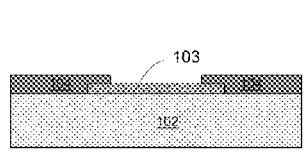
FIG. 2A-FIG. 2K illustrate an exemplary process for good adhesion of IMC on a Cu pillar bump according to another embodiment.
Figure 2B:
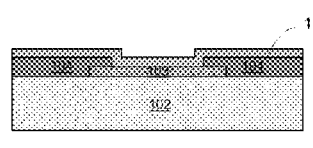
Figure 2C:
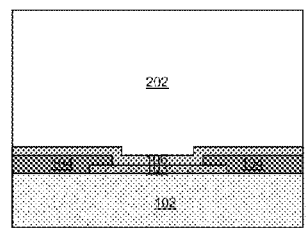
Figure 2D:
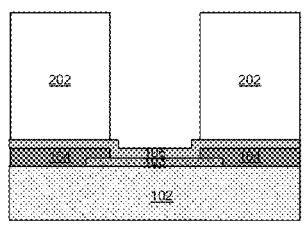
Figure 2E:
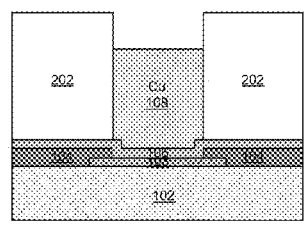
Figure 2F:
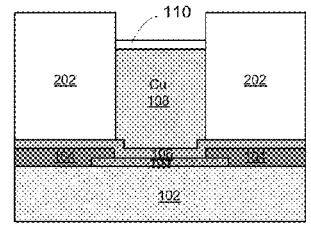
Figure 2G:
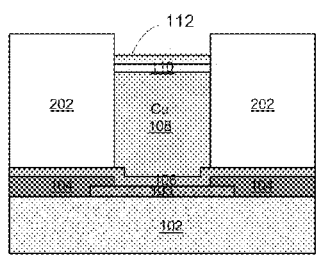
Figure 2H:
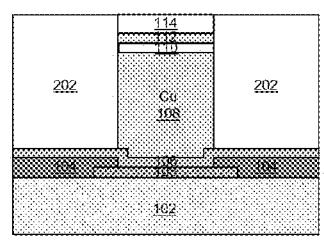
Figure 2I:
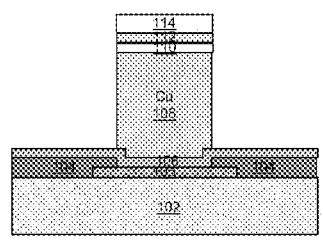
Figure 2J:
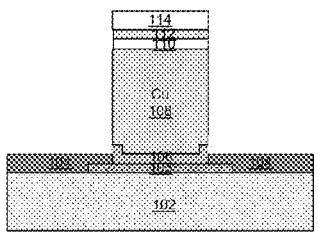

The seed layer 106 is deposited in FIG. 2B, e.g., TiW/Cu, Ti/Cu, or Ti/Cu/Ni/Au, etc. The photoresist layer 202 is deposited in FIG. 2C and partially removed in FIG. 2D for Cu pillar layer 108 deposition by plating in FIG. 2E, e.g., electroplating or electroless plating. A diffusion barrier layer 110 (e.g., Ni, Ni(P), or Ni(V), etc.) is deposited by electrolytic or electroless plating in FIG. 2F, which is a diffusion barrier for the Cu pillar layer 108. Optionally, a thin layer (e.g., Au) for better wettability can be also plated on top of the diffusion barrier layer 110. A thin Cu cap layer 112 is plated over the diffusion barrier layer 110 in FIG. 2G to provided limited Cu source to react with solder (e.g., Sn) and the diffusion barrier layer (e.g., Ni) 110. A solder layer 114 (e.g., Sn) is deposited on top of the Cu cap layer 112 in FIG. 2H, and the photoresist is stripped in FIG. 2I. The seed layer 106 is etched in FIG. 2J, and an IMC layer 116 (e.g., Ni—Cu—Sn) which provides good adhesion between the diffusion barrier layer 110 and the solder layer 114 is formed during reflow process in FIG. 2K.

Figure 2K:
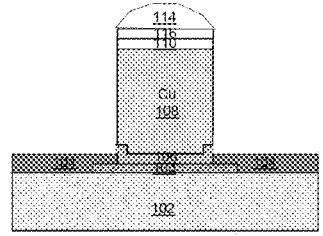
Figure 3A:
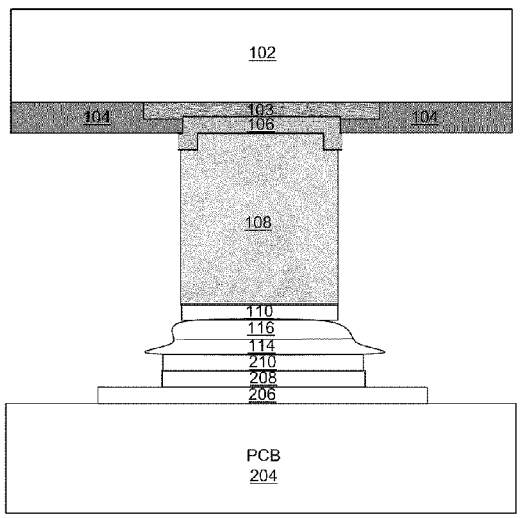
FIG. 3A-FIG. 3B illustrate exemplary flip chip bonding structures after the process for good adhesion of IMC on Cu pillar bump shown in FIG. 2A-FIG. 2K, and a flip chip attachment to a PCB according to another embodiment.
Figure 3B:
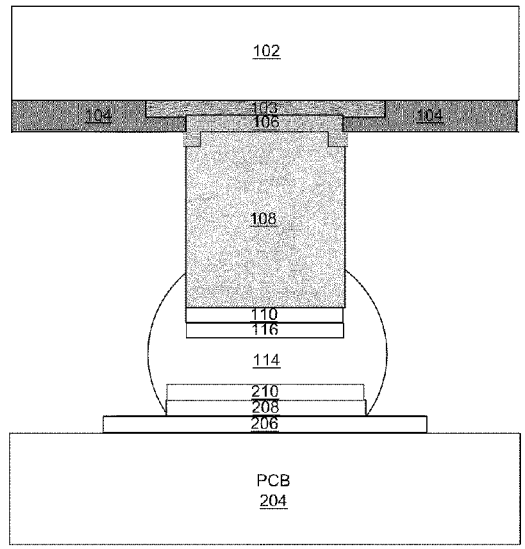

FIG. 3A-FIG. 3B illustrate exemplary structures formed after the process for good adhesion of IMC on a Cu pillar bump as shown in FIG. 2A-FIG. 2K, and a flip chip attachment to a PCB according to another embodiment. FIG. 3A shows a structure with the thickness of the solder layer 114 less than 8 µm, while FIG. 3B shows a structure with the thickness of the solder layer 114 greater than 8 µm. The structure shown in FIG. 2K is flipped upside down and attached to the printed circuit board (PCB) 204 at the bottom. The PCB 204 has a conductive layer 206 and a diffusion barrier layer 208 on top, and an IMC layer 210 (e.g., Cu—Ni—Sn) is formed. The IMC layer 210 is also formed from another thin Cu cap layer from the PCB side.

The solder layer 114 can be made of Sn, SnAg, Sn—Pb, SnAgCu (Cu weight percentage<0.3%), SnAgZn, SnZn, SnBi—In, Sn—In, Sn—Au, SnPb, SnCu, SnZnIn, or SnAgSb, or any other suitable material. If the solder layer 114 originally includes Cu, e.g., SnAgCu (SAC), Sn—Cu, etc., the thin Cu cap layer 112 can provide the source element to react with the diffusion barrier layer 110 and the solder layer 114 to form a $(Cu,Ni)_xSn_y$ IMC. This $(Cu,Ni)_xSn_y$ IMC is good for solder adhesion. Also the solder volume does not change after reflow and other thermal annealing, where the volume change may cause a reliability issue.

The advantageous features of the present invention include good adhesion of IMC on Cu pillar bumps and reliable structural integrity. A skilled person in the art will appreciate that there can be many embodiment variations of this invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a pillar structure, comprising:
   forming a titanium-containing seed layer over a metal line layer;
   forming a copper-containing pillar layer over the titanium-containing seed layer;
   depositing a diffusion barrier layer over the copper-containing pillar layer;
   forming an intermetallic compound (IMC) over the diffusion barrier layer, wherein forming the IMC comprises:
      depositing a copper-containing cap layer over the diffusion barrier layer;
      depositing a solder layer over the copper-containing cap layer, the solder layer having a thickness greater than 8 µm; and
      thermal treating the copper-containing cap layer and the solder layer to form the IMC; and
   controlling a thickness of the copper-containing cap layer in order to determine a thickness of the IMC.

2. The method of claim 1, wherein the copper-containing cap layer is deposited with a thickness of about 0.1 µm-1.5 µm.

3. The method of claim 1, wherein thermal treating forms the IMC, which is made of Cu—Ni—Sn, with a maximum thickness of 7 µm.

4. The method of claim 1 further comprising depositing Au with a thickness of about 0.01 μm 0.5 μm on top of the diffusion barrier layer prior to forming the IMC.

5. The method of claim 4, further comprising depositing a cap layer over the Au.

6. The method of claim 1, wherein the diffusion barrier layer comprises Ni, Ni(P), Ni(V), or any combinations thereof.

7. The method of claim 1, wherein the diffusion barrier layer is deposited with a thickness of about 0.5 μm-4 μm.

8. The method of claim 1, wherein the copper-containing pillar layer is formed with a thickness of about 5 μm-150 μm.

9. A pillar structure, comprising:
a titanium-containing seed layer;
a copper-containing pillar layer over the titanium-containing seed layer;
a diffusion barrier layer over the copper-containing pillar layer;
an intermetallic compound (IMC) over the diffusion barrier layer; and
a solder layer over the IMC, wherein the solder layer has a thickness of greater than 8 μm.

10. The structure of claim 9, wherein the diffusion barrier layer comprises Ni, Ni(P), Ni(V), or any combinations thereof.

11. The structure of claim 9, wherein the diffusion barrier layer has a thickness of about 0.5 μm-4 μm.

12. The structure of claim 9, wherein the copper-containing pillar layer has a thickness of about 5 μm-150 μm.

13. The structure of claim 9, wherein the IMC comprises Cu—Ni—Sn with a maximum thickness of 7 μm.

14. A flip-chip bonding structure comprising:
a printed circuit board; and
a semiconductor wafer, which is flip-chip bonded with the printed circuit board, having a pillar structure, the pillar structure comprising:
a titanium-containing seed layer;
a copper-containing pillar layer over the titanium-containing seed layer;
a diffusion barrier layer over the copper-containing pillar layer;
an intermetallic compound (IMC) over the diffusion barrier layer; and
a solder layer for flip-chip bonding with the printed circuit board, wherein the solder layer has a thickness greater than 8 μm.

15. The flip-chip bonding structure of claim 14, wherein the diffusion barrier layer comprises Ni, Ni(P), Ni(V), or any combinations thereof.

16. The flip-chip bonding structure of claim 14, wherein the diffusion barrier layer has a thickness of about 0.5 um-4 um.

17. The flip-chip bonding structure of claim 14, wherein the copper-containing pillar layer has a thickness of about 5 μm-150 μm.

18. The flip-chip bonding structure of claim 14, wherein the IMC comprises Cu—Ni—Sn with a maximum thickness of 7 μm.

19. The flip-chip bonding structure of claim 14, further comprising a conductive layer over the printed circuit board.

20. The flip-chip bonding structure of claim 19, further comprising a second diffusion barrier layer over the conductive layer.

* * * * *